(12) United States Patent
Grande et al.

(10) Patent No.: US 11,829,174 B2
(45) Date of Patent: Nov. 28, 2023

(54) HIGH VOLTAGE REGULATOR

(71) Applicant: SK hynix Inc., Gyeonggi-do (KR)

(72) Inventors: Andrea Grande, Agrate Brianza (IT);
Marco Passerini, Agrate Brianza (IT);
Stefano Malacrida, Agrate Brianza (IT)

(73) Assignee: SK hynix Inc., Gyeonggi-do (KR)

( * ) Notice: Subject to any disclaimer, the term of this patent is extended or adjusted under 35 U.S.C. 154(b) by 134 days.

(21) Appl. No.: 17/395,335

(22) Filed: Aug. 5, 2021

(65) Prior Publication Data

US 2022/0253083 A1 Aug. 11, 2022

(30) Foreign Application Priority Data

Feb. 5, 2021 (IT) .................. 102021000002618

(51) Int. Cl.
| | | |
|---|---|---|
| *G05F 1/575* | (2006.01) | |
| *G05F 3/24* | (2006.01) | |
| *G05F 3/26* | (2006.01) | |
| *G11C 5/14* | (2006.01) | |
| *H02M 3/07* | (2006.01) | |

(52) U.S. Cl.
CPC ............ *G05F 1/575* (2013.01); *G05F 3/247* (2013.01); *G05F 3/262* (2013.01); *G11C 5/145* (2013.01); *H02M 3/073* (2013.01)

(58) Field of Classification Search
CPC .......... G05F 1/575; G05F 3/247; G05F 3/262; H02M 3/073; G11C 5/145
USPC ........................................................ 323/280
See application file for complete search history.

(56) References Cited

U.S. PATENT DOCUMENTS

| | | | | |
|---|---|---|---|---|
| 2014/0117950 A1* | 5/2014 | Ng | ........................ | G05F 1/575 323/265 |
| 2015/0009763 A1* | 1/2015 | Kumazaki | .............. | G11C 16/30 365/185.21 |

FOREIGN PATENT DOCUMENTS

KR 10-2009-0101739 A 9/2009

OTHER PUBLICATIONS

Search Report by issued the European Patent Office dated Oct. 11, 2021.

* cited by examiner

*Primary Examiner* — Yemane Mehari
(74) *Attorney, Agent, or Firm* — IP & T GROUP LLP (57) ABSTRACT

Disclosed herein is a regulator for a non-volatile memory. The regulator comprises a high voltage supply terminal, a low voltage supply terminal, an output terminal, a ground terminal and an internal node. The regulator further comprises an input amplifier inserted between the low voltage supply terminal and the ground terminal and outputting a first output voltage at a first intermediate output node according to a reference voltage and a feedback voltage provided at its negative and positive input terminals, respectively; a mirror circuit forming two current paths between the internal node and the ground terminal and between the internal node and a second intermediate output node respectively; and a cascode block coupled between the high voltage supply terminal and the internal node and operating in response to a voltage at the second intermediate output node of the regulator where the two current path is formed by the mirror circuit.

20 Claims, 9 Drawing Sheets

FIG. 8

HIGH VOLTAGE REGULATOR

CROSS-REFERENCE TO RELATED APPLICATION

This application claims priority based upon Italian patent application No. 102021000002618, filed on Feb. 5, 2021, the disclosure of which is hereby incorporated in its entirety by reference herein.

BACKGROUND

Field of the Invention

The present disclosure relates to a high voltage regulator.
The disclosure relates to a high voltage regulator for providing bias voltages to a non-volatile memory.

Background of the Invention

Among various types of flash memory devices, NAND-type flash memory devices are increasingly used as a high capacity data storage media. High voltage regulators are used for providing different voltage levels to the NAND stack. For example, each cell of a flash memory needs to be programmed to store information by trapping electrons in the floating gate. The programming operation is performed by driving a strong positive voltage onto the control gate to force a current to flow from the channel through the floating gate to the control gate. Usually, different levels of programming voltages are required, and a high voltage regulator is used to provide different levels of voltage.

Similarly, high voltage bias levels are also needed during a read operation and an erase operation.

More particularly, a NAND flash memory usually comprises a High Voltage or HV linear regulator being a DAC (Digital-to-Analog-Converter) block able to output an analog voltage higher than a supply voltage.

Figure 1A:
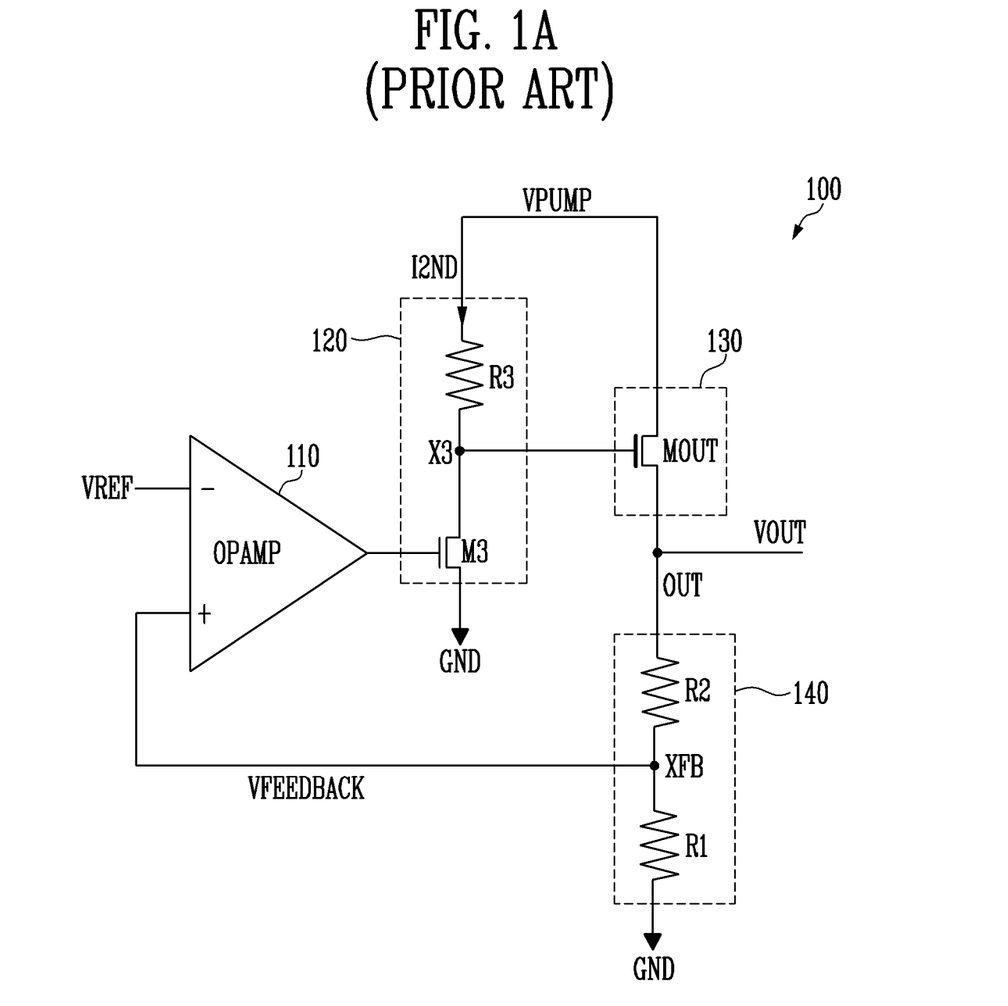

FIG. 1A shows a HV linear regulator for a NAND flash memory realized according to a method of prior art.

The HV linear regulator 100 comprises a first stage 110 including an operational amplifier OPAMP for receiving a reference voltage VREF and a feedback voltage VFEEDBACK to output a voltage amplifying the difference of the reference voltage VREF and the feedback voltage VFEEDBACK. The HV linear regulator 100 further comprises a second stage 120 inserted between a charge pump voltage VPUMP and ground GND, and comprising a common source configuration including a series of a further resistor R3 and a NMOS transistor M3 being interconnected at an internal node X3, in turn connected to a gate terminal of a NMOS transistor MOUT of a third stage 130. The gate of the NMOS transistor M3 of the second stage 120 is electrically connected to the output of the operational amplifier OPAMP of the first stage 110. Moreover, the NMOS transistor MOUT of the third stage 130 is inserted between the charge pump voltage VPUMP and an output terminal OUT of the HV linear regulator 100 and acts as a source follower stage supplied by charge pump voltage VPUMP as obtained at an output terminal of a charge pump circuit (not shown).

Usually, the NMOS transistor MOUT of the third stage 130 and the NMOS transistor M3 of the second stage 120 are high voltage transistors. Moreover, the operational amplifier OPAMP usually comprises only low voltage transistors.

Finally, the HV linear regulator 100 comprises a voltage divider 140 formed by a series of a first resistor R1 and a second resistor R2 inserted between the output terminal OUT and ground GND, and having a common node XFB providing the feedback voltage VFEEDBACK to the operational amplifier OPAMP. In particular, the first resistor R1 is inserted between the common node XFB and ground GND, and the second resistor R2 is inserted between the output terminal OUT and the common node XFB.

Figure 1B:
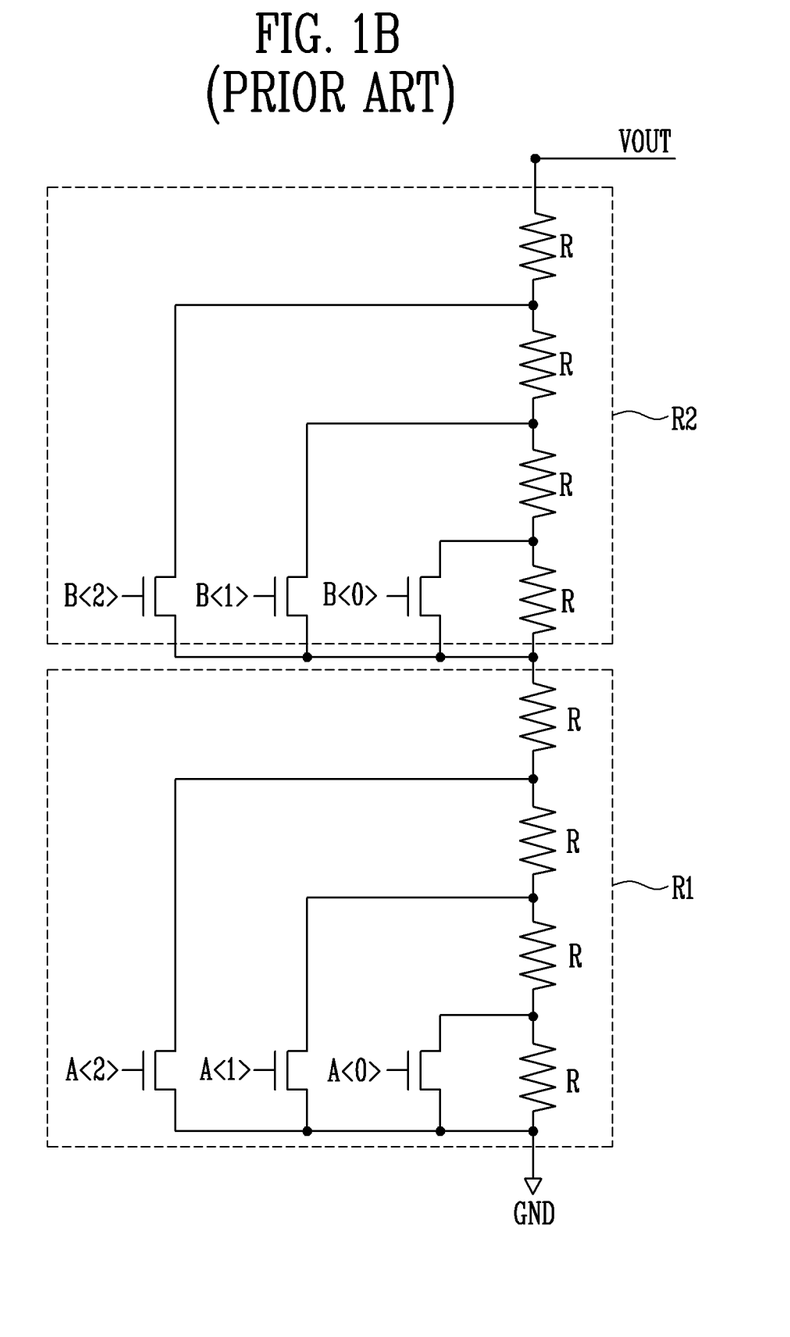
FIG. 1B schematically shows a circuit diagram wherein resistors value are changed to obtain D/A conversion according to a method of prior art.

A bus of digital signals might change R1 or R2 (or both) resistor values to make the D/A (Digital to Analog) conversion, as shown in FIG. 1B. In this case, each resistor R1 and R2 comprises a plurality of resistors R and a plurality of enabling MOS transistors, and each of the plurality of resistors R may have the same resistance value or different resistance values. For example, each resistor R1 and R2 comprises a series of a plurality of resistive elements as well as a plurality of enabling MOS transistors connected to different interconnecting nodes of the resistive elements, to enable a different number of resistive elements according to requirements, the enabling MOS transistors being connected to the digital signals.

'High voltage' used for a high voltage NMOS transistor means a range from 5 or 6 volts up to 24 volts in the programming step. The typical range of High Voltage could be from 7 or 8 to 20 volts.

The operational amplifier OPAMP forms a feedback network receiving the reference voltage VREF and the feedback voltage VFEEDBACK which is a voltage divided by the resistive network formed by R1 and R2 of the voltage divider. The current value I2ND supplied to the second stage 120 is determined by the following formula:

$$I2ND = \frac{VPUMP - (VOUT + Vgs(MOUT))}{R3}$$

Due to the use of a charge pump circuit to provide the charge pump voltage, which has a current efficiency well below 1, it is important to minimize DC bias current of the second stage 120 and of the third stage 130. More particularly, DC bias current of the second stage 120 depends on the followings values: a level of the output voltage VOUT at the output terminal OUT of the HV linear regulator 100; and the voltage value Vgs (MOUT) between the gate and source terminal of the NMOS transistor MOUT of the third stage 130 and the value of the further resistor R3 of the second stage 120.

While the level of the output voltage VOUT changes according to the regulator setting, the voltage value Vgs (MOUT) and the value of the further resistor R3 change in model corners and temperature. Hence, to decrease the current value I2ND the value of the further resistor R3 of the second stage 120 is to be increased.

However, an increase of the value of the further resistor R3 results in an area penalty and a parasitic increase of the HV linear regulator 100 as a whole.

To avoid increasing the size of such a resistance, a current mirror could also be used. In particular, a voltage adder comprising an amplifier and a mirror circuit is disclosed in the Korean patent publication No. KR 10-2009-0101739 in the name of Samsung Electronics Co., Ltd. More particularly, according to this Korean patent application, a current path according to a voltage output from an amplifier is formed and the current is controlled by providing a mirror circuit between a voltage terminal and a ground terminal, such a mirror circuit comprising PMOS or NMOS transistors.

SUMMARY

Various embodiments of the present invention are directed to a regulator, in particular a high voltage linear regulator for providing bias voltages to a non-volatile memory, which comprises a current mirror able to lower the current of a common source stage supplied by a charge pump voltage without increasing the area occupation of the regulator as a whole and allowing the use of high voltage PMOS transistors with a low breakdown voltage, as usual in the NAND flash technology.

In an embodiment of the present invention, the regulator comprises a high voltage supply terminal, a low voltage supply terminal, an output terminal, a ground terminal and an internal node, an input amplifier inserted between the low voltage supply terminal and the ground terminal and outputting a first output voltage at a first intermediate output node according to a reference voltage and a feedback voltage provided at its negative and positive input terminals, respectively, a mirror circuit forming two current paths between the internal node and the ground terminal and between the internal node and a second intermediate output node of the regulator, respectively, and a cascode block coupled between the high voltage supply terminal and the internal node and operating in response to a voltage at the second intermediate output node of the regulator where one of the two current paths is formed by the mirror circuit.

The regulator may further comprise an output stage including a final transistor inserted between the high voltage supply terminal and the output terminal of the regulator, acting as a source follower stage, the final transistor having a control terminal connected to the second intermediate output node of the regulator, and a voltage divider stage formed by a series of a first resistor and a second resistor inserted between the output terminal of the regulator and the ground terminal of the regulator and having a common node providing the feedback voltage to the input amplifier. More particularly, the final transistor has a gate terminal coupled to the second intermediate output node and a resistor feedback network.

Moreover, the regulator may further comprise a common source transistor inserted between the second intermediate output node and the ground terminal and having a gate terminal connected to the first intermediate output node.

With the regulator topology according to the present application, the bias current of the second stage of the regulator which is the current flowing through the drain terminal of the common source transistor is determined by the bias current at the input terminal of the mirror circuit.

In another embodiment of the present invention, the bias current coupled to the input terminal of the mirror circuit is generated by an additional transistor having its drain terminal coupled to the input terminal of the mirror circuit, its source terminal coupled to ground, and its gate terminal coupled to a second internal node of the input amplifier.

The regulator might further comprise two further cascode transistors connected between input terminal of the mirror circuit and drain of additional transistor and between second intermediate output terminal and drain of common source transistor, respectively. These two further cascode transistors have their gate connected to a bias voltage.

The regulator might further comprise a precharge transistor which is inserted in parallel to the first cascode transistor between the high voltage supply terminal and the internal node with its gate receiving a precharge bias voltage.

Finally, the regulator may further comprise a Miller compensation capacitor as well as a feedback capacitor.

In another embodiment of the present invention, the regulator comprises, an amplifier suitable for comparing a reference voltage and a feedback voltage to generate an intermediate voltage, a first transistor coupled between an intermediate node and a ground and operative according to the intermediate voltage, a second transistor coupled between a high voltage supply and an output node and operative according to a voltage level of the intermediate node, a voltage divider stage coupled between the output node and the ground and suitable for generating the feedback voltage, a third transistor coupled between the high voltage supply and an internal node and operative according to the voltage level of the intermediate node and a mirror circuit coupled to the internal node and suitable for generating a first current flowing from the internal node to the ground and a second current flowing from the internal node to the intermediate node.

BRIEF DESCRIPTION OF THE DRAWINGS

The features and advantages of the present disclosure will be apparent from the following description of embodiments thereof given by way of indicative and non-limiting examples with reference to the annexed drawings, in which FIG. 1A schematically shows a circuit diagram of a prior art high voltage regulator.

DETAILED DESCRIPTION OF THE EMBODIMENTS

Various embodiments of the present invention will be described in detail below with reference to the accompanying drawings. While the present invention is shown and described in connection with embodiments thereof, it will be apparent to those skilled in the art that various modifications can be made without departing from the spirit and scope of the invention. The terms and words used in the specification and claims should not be construed as their ordinary or dictionary sense. In addition, detailed descriptions of constructions well known in the art may be omitted to avoid unnecessarily obscuring the gist of the present invention.

Figure 2:
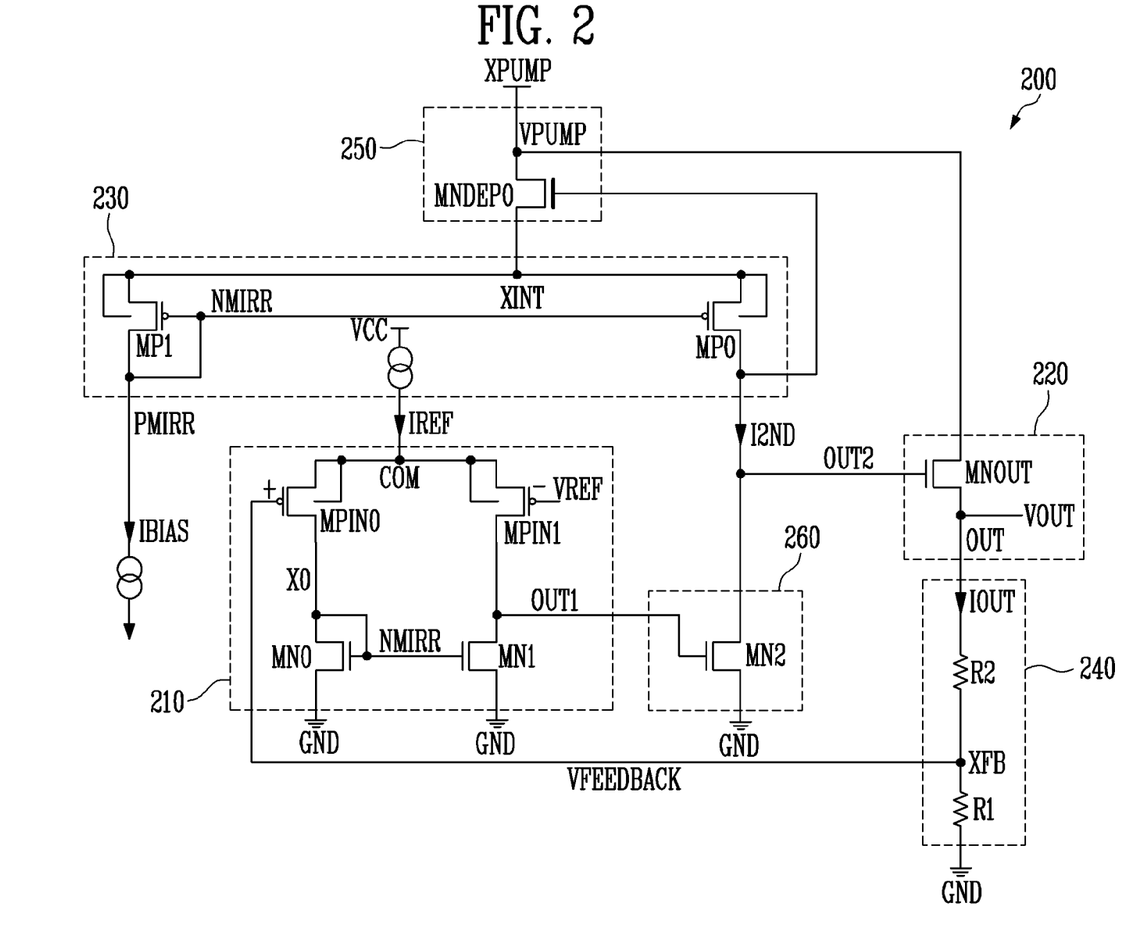
FIG. 2 schematically shows a circuit diagram of a regulator according to an embodiment of the present invention.

FIG. 2 schematically shows a circuit diagram of a regulator, in particular a high voltage linear regulator for a non-volatile memory in accordance with an embodiment of the present invention.

The regulator 200 comprises a high voltage supply terminal XPUMP, in particular receiving a charge pump voltage VPUMP as obtained at an output terminal of a charge pump circuit (not shown) and a ground terminal GND as well as an input amplifier 210 outputting a first output voltage at a first intermediate output node OUT1 according to a reference voltage VREF and a feedback voltage VFEEDBACK provided at its negative and positive input terminals, respectively. The input amplifier 210 is thus also indicated as a first stage.

More particularly, the input amplifier 210 is inserted between a low supply voltage VCC and ground terminal GND and comprises a current generator connected between low supply voltage VCC and a common node COM and providing thereto a reference current IREF.

Furthermore, the input amplifier 210 comprises a first input transistor MPIN0, inserted between a common node COM and a first circuit node X0 and receiving the feedback voltage VFEEDBACK at its gate terminal, the first input transistor gate terminal being the positive input terminal (+) of the input amplifier 210. The input amplifier 210 also comprises a second input transistor MPIN1, inserted between the common node COM and the first intermediate output node OUT1 of the input amplifier 210 and receiving the reference voltage VREF at its gate terminal, the second input transistor gate terminal being the negative input terminal (−) of the input amplifier 210.

Moreover, the input amplifier 210 comprises a first output transistor MN0 being diode-connected and coupled between the first circuit node XO and the ground terminal GND as well as a second output transistor MN1 inserted between the first intermediate output node OUT1 and the ground terminal GND. The second output transistor MN1 further has a gate terminal connected to a gate terminal of the first output transistor MN0 at a mirror circuit node NMIRR.

The first and second input transistors MPIN0, MPIN1 may be PMOS transistors having respective bulk terminals, in the example shown in the figure connected to the common node COM. The first and second output transistors MN0, MN1 may be NMOS transistors. In an embodiment, all transistors of the input amplifier 210 may be low voltage transistors. In another embodiment, the first and second output transistors MN0, MN1 may be high voltage transistors.

The regulator 200 further comprises a mirror circuit 230 forming a current path between the high voltage supply terminal XPUMP and the ground terminal GND and being further connected to a common source transistor MN2 of a second stage 260 and to an output stage 220. The output stage 220 comprises a final transistor MNOUT inserted between the high voltage supply terminal XPUMP and an output terminal OUT of the regulator 200. The output stage 220 is thus also indicated as a third stage.

More particularly, the mirror circuit 230 comprises a first mirror transistor MP0 being inserted between an internal node XINT at an internal voltage and a second intermediate output node OUT2 and having a gate terminal connected to a gate terminal of a second mirror transistor MP1 being diode connected and inserted between the internal node XINT and a further mirror circuit node PMIRR connected to a biasing current generator of a bias current IBIAS. The second intermediate output node OUT2 is in turn connected to a gate terminal of final transistor MNOUT of the output stage 220 and to a drain terminal of the common source transistor MN2 of the second stage 260 and providing thereto a second stage current I2ND.

Finally, the common source transistor MN2 is inserted between the second intermediate output node OUT2 and the ground terminal GND and having a gate terminal connected to the first intermediate output node OUT1. Such a common source transistor MN2 thus receives from the second intermediate output node OUT2 the second stage current I2ND.

The first mirror transistor MP0 and second mirror transistor MP1 may be PMOS transistors having respective bulk terminals connected to the internal node XINT.

According to an embodiment, the first mirror transistor MP0, the second mirror transistor MP1, the common source transistor MN2 and the final transistor MNOUT may be high voltage transistors.

The regulator 200 further comprises a voltage divider stage 240 formed by a series of a first resistor R1 and a second resistor R2 inserted between the output terminal OUT and the ground terminal GND and having a common node XFB providing the feedback voltage VFEEDBACK to the input amplifier 210. In particular, the first resistor R1 is inserted between the common node XFB and the ground terminal GND and the second resistor R2 is inserted between the output terminal OUT and the common node XFB.

It can be verified that the second stage current I2ND is expressed as follows.

$$I2ND = IBIAS * \frac{\frac{W(MP0)}{L(MP0)}}{\frac{W(MP1)}{L(MP0)}}$$

Here, W and L are the width and length of the corresponding transistor, respectively.

The second stage current I2ND becomes usually expressed as follows.

$$I2ND = IBIAS * \frac{W(MP0)}{W(MP1)}$$

The second stage current I2ND is expressed as above when the transistors MP0 and MP1 have a same length L, which is usually the case for a well-designed current mirror.

For simplicity in the rest of the description L(MP0)=L(MP1) without limiting the scope of this application.

In this way, the regulator 200 of FIG. 2 is able to reduce the second stage current I2ND with almost no penalty in area by suitably designing the size ratio W(MP0)/W(MP1) of the mirror transistors, in particular by decreasing such ratio with a minor impact on the area of the regulator 200 as a whole with respect to the known solutions.

Moreover, the second stage current I2ND is now independent from the output voltage level VOUT of the regulator 200 and from the charge pump voltage VPUMP.

Moreover, the total current drawn by a charge pump circuit connected to the regulator 200 is equal to IBIAS+I2ND+IOUT, being IOUT a current flowing in the voltage divider stage 240.

The regulator 200 also comprises a first cascode transistor MNDEP0 in a cascode block 250 coupled between the high voltage supply terminal XPUMP and the mirror circuit 230, in particular at its internal node XINT, and operating in response to a voltage at the second intermediate output node OUT2 where the current path is formed by the mirror circuit 230.

In an embodiment, the first cascode transistor MNDEP0 may be a NMOS depletion transistor. For example, the first cascode transistor MNDEP0 may be a high voltage NMOS depletion transistor.

NMOS depletion transistors have threshold voltage below zero. A typical voltage threshold value for a high voltage NMOS depletion transistor may be in the range of −3V to −1V.

In this way, the first cascode transistor MNDEP0 in cascode block 250 is able to prevent the breakdown of the transistors in the mirror circuit 230, in particular of the first mirror transistor MP0.

In fact, high voltage PMOS transistors being usable in the NAND flash technology have usually a low junction breakdown voltage BV, typically around 8V~10V, while high voltage NMOS transistors in the same technology have a junction breakdown voltage BV higher than 24V.

Without the first cascode transistor MNDEP0 in the cascode block 250, the first mirror transistor MP0 may incur a breakdown when the voltage difference Vsd between its source and drain terminals and the voltage difference Vbd between its bulk and drain terminals respectively, both being equal to VPUMP−VOUT+Vgs(MNOUT), is higher than its breakdown voltage BV.

To avoid the breakdown of the first mirror transistor MP0, the first cascode transistor MNDEP0 is inserted between the high voltage supply terminal XPUMP and the internal node XINT being a common source terminal of the first mirror transistor MP0 and the second mirror transistor MP1, with its control or gate terminal connected to a drain terminal of the first mirror transistor MP0 and its source terminal connected to a source terminal of the first mirror transistor MP0. In this way, it is verified by the following equation:

$$Vsd(MP0)=Vbd(MP0)=-Vgs(\text{MNDEP0})$$

The gate-source voltage difference Vgs of the first cascode transistor MNDEP0 is equal to the drain-source voltage difference Vds and the drain-bulk voltage difference Vdb of the first mirror transistor MP0.

This means that during the on state of the regulator 200, the source-drain voltage difference Vsd and the bulk-drain voltage difference Vbd of the first mirror transistor MP0 is set by the gate-source voltage difference Vsg of the first cascode transistor MNDEP0 of the cascode block 250, which is in the range −3V~−1V being the first cascode transistor MNDEP0 a NMOS depletion transistor.

Hence, also the source-drain voltage difference Vsd and the bulk-drain voltage difference Vbd of the first mirror transistor MP0 is set in the range 1V~3V which is lower than the breakdown voltage BV of the first mirror transistor MP0.

In this way, the regulator 200 of FIG. 2 is able to protect the first mirror transistor MP0 from breakdown voltage BV.

Figure 3:
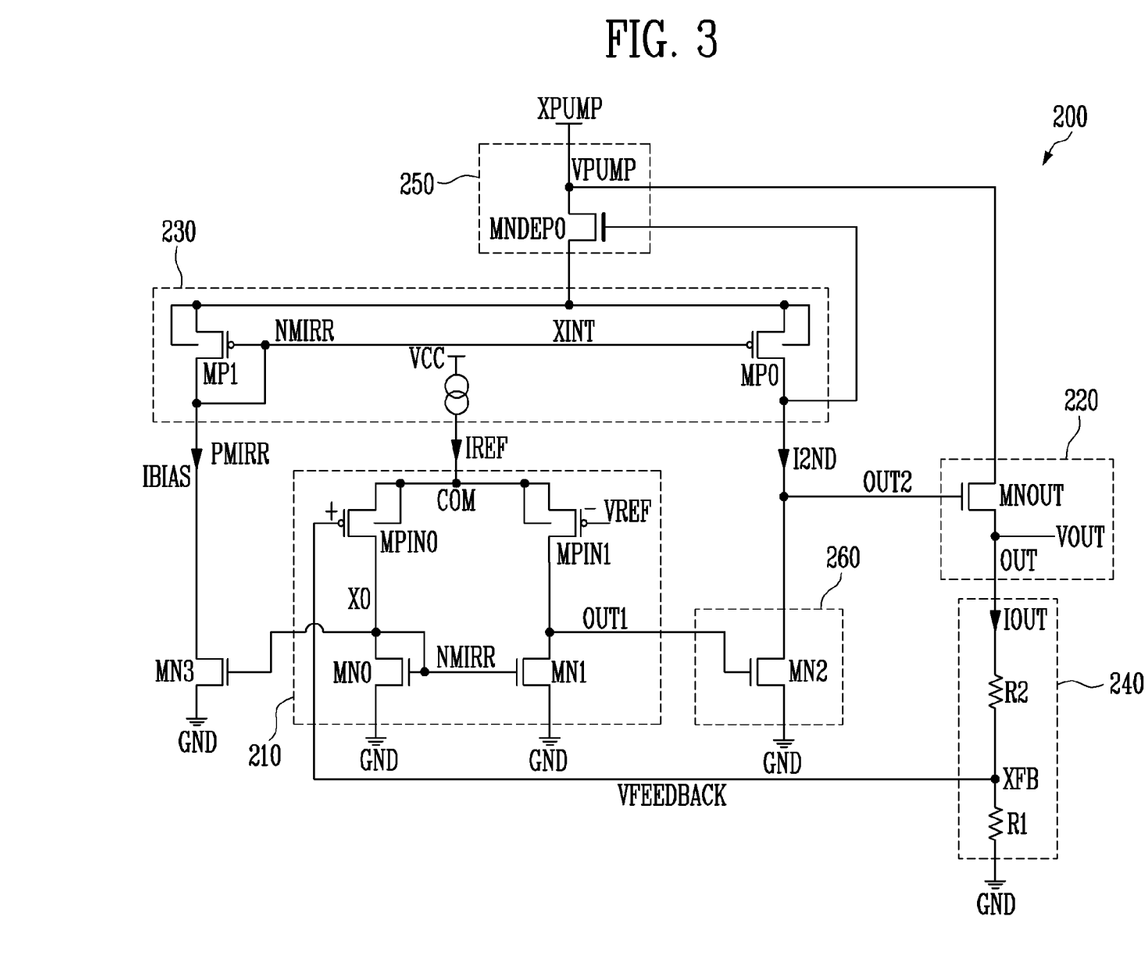
FIGS. 3 to 8 schematically shows a circuit diagram of a regulator according to alternative embodiments of the present invention.

FIG. 3 schematically shows a circuit diagram of a regulator according to an alternative embodiment of the present invention.

The regulator 200 of FIG. 3 comprises all elements of regulator 200 of FIG. 2, having been indicated with the same reference numbers.

According to this alternative embodiment, the regulator 200 further comprises a current buffer transistor MN3 being inserted between the further mirror circuit node PMIRR of mirror circuit 230 and the ground terminal GND and receiving the bias current IBIAS. The current buffer transistor MN3 has a gate terminal connected to the mirror circuit node NMIRR of input amplifier 210.

In an embodiment, the current buffer transistor MN3 may be a high voltage NMOS transistor.

In this way, the slew rate of the regulator 200 is increased without increasing DC current consumption. A maximum value of the slew rate of a high voltage regulator is determined by, among other factors, a maximum current value being provided to the output stage 220, which is in turn determined by the current value at the second intermediate output node OUT2 of the mirror circuit 230 of regulator 200 and having a high slew rate allows a fast startup or a fast output drop recovery of a regulator, being one of the utmost important parameters thereof.

As already indicated, the current provided to second intermediate output node OUT2, being the second stage current I2ND is given by: IBIAS*W(MP0)/W(MP1) and it could be possible to increase the slew rate value by increasing the value of the bias current IBIAS or of the mirror PMOS transistors size ratio. This approach has a main drawback tied to the corresponding increasing of the current consumption in DC or stationary state of the regulator 200 as a whole.

According to the alternative embodiment shown in FIG. 3, the bias current IBIAS, being a fixed DC current, is fed by current buffer transistor MN3 whose gate is connected with gate and drain terminals of the first output transistor MN0, MN3 and MN0 being in this way in a current mirroring configuration.

Hence, the value of the bias current IBIAS is made dependent on the reference current IREF of the input amplifier 210, its DC value given by the following formula.

$$IBIAS = \frac{IREF}{2} * \frac{W(MN3)}{W(MN0)}$$

Similarly, it can be verified that the second stage current I2ND is expressed as follows.

$$I2ND = IBIAS * \frac{W(MP0)}{W(MP1)}$$

Its DC value is given by the following formula.

$$IBIAS = \frac{IREF}{2} * \frac{W(MN3)}{W(MN0)} * \frac{W(MP0)}{W(MP1)}$$

As previously indicated, all mirroring transistors have been considered as having a same length which is usually the case for a well-designed mirror without limiting the scope of this application.

As an example, the regulator 200 may be designed according to the following sizes: W(MP0)=W(MP1) and W(MN3)=W(MN0). In this case the second stage current I2ND is equal to IREF/2, being the reference current IREF the DC bias current IBIAS of the input amplifier 210.

It should be noted that, at startup or during a drop in the output voltage under a slew rate condition, the feedback voltage VFEEDBACK is considerably lower than the reference voltage VREF. This means that inside the input amplifier 210 the first input transistor MPIN0 draws almost all reference current IREF while the second input transistor MPIN1 does not draw any current.

In this way, the first output transistor MN0 draws all reference current IREF (instead of IREF/2 as during the DC condition) and also the current buffer transistor MN3, the second mirror transistor MP1 and the first mirror transistor MP0 draw a current value equal to the reference current IREF (instead of IREF/2 as during the DC condition).

For this reason, the current value at the second intermediate output node OUT2 under the slew rate condition is increased by a factor of two with respect to a DC current value, while the DC consumption of the regulator 200 is not increased.

The regulator 200 of FIG. 3 thus has a high slew rate allowing fast startup and output drop recovery operations.

Figure 4:
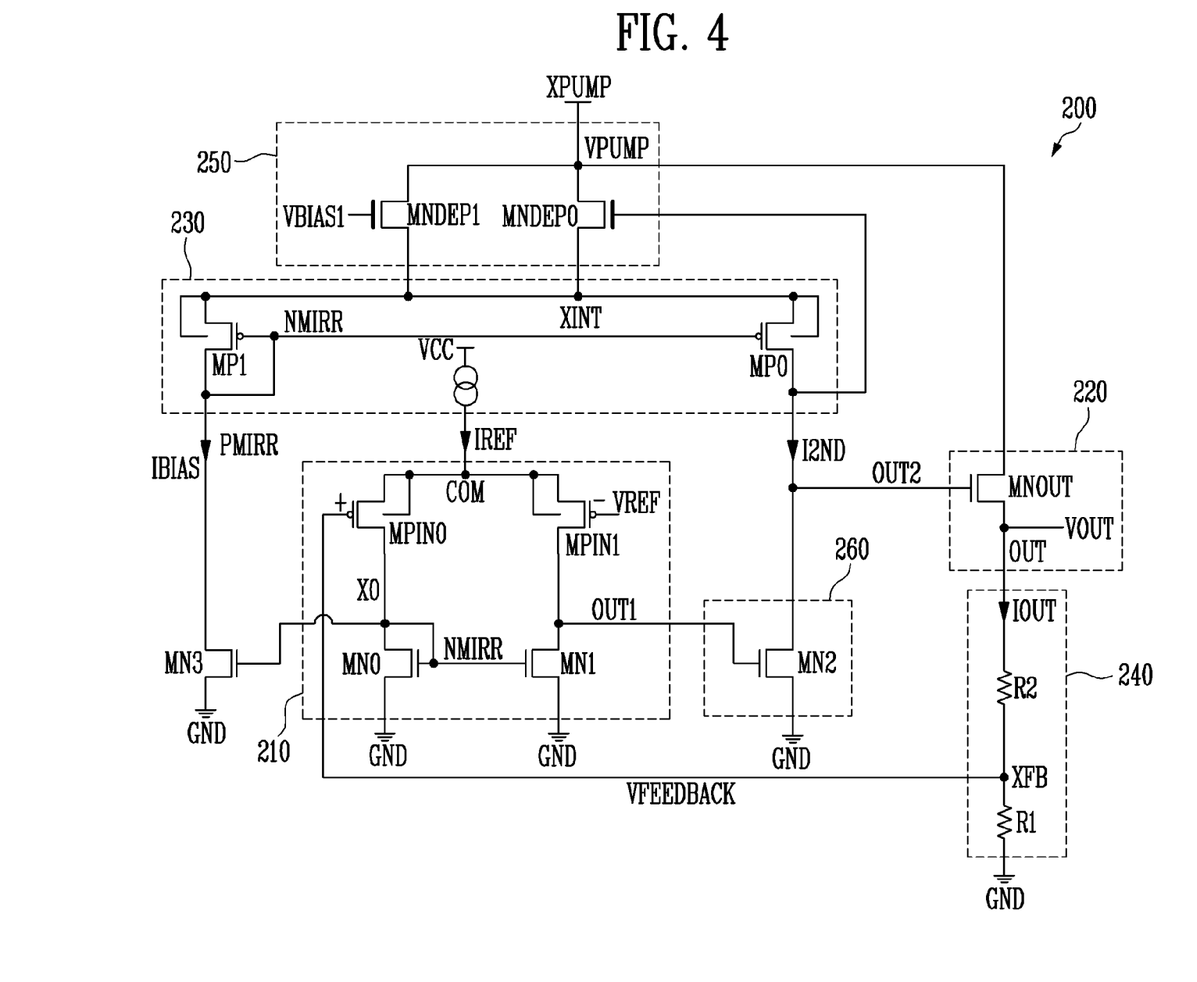

FIG. 4 schematically shows a circuit diagram of a regulator according to a further alternative embodiment of the present invention.

The regulator 200 of FIG. 4 comprises all elements of regulator 200 of FIG. 3, having been indicated with the same reference numbers.

According to this alternative embodiment, the cascode block 250 of the regulator 200 further comprises a precharge transistor MNDEP1, being inserted in parallel to the first cascode transistor MNDEP0, i.e., between the high voltage supply terminal XPUMP and the internal node XINT of the mirror circuit 230. Moreover, the precharge transistor MNDEP1 has a gate terminal receiving a precharge bias voltage VBIAS1, to ensure startup in all conditions.

In an embodiment, the precharge transistor MNDEP1 may be a NMOS depletion transistor. For example, the precharge transistor may be a high voltage NMOS depletion transistor.

It can be verified that, starting from an initial condition wherein second intermediate output node OUT2 is approximately 0V, all transistors included in the regulator 200 are in an off state.

For sake of simplicity, the PMOS transistors of the mirror circuit 230, in particular the first mirror transistor MP0 and the second mirror transistor MP1 have a same threshold voltage Vth(MP).

It can be verified that, when a startup operation is initiated, if the absolute value of the threshold voltage of the first cascode transistor MNDEP0 is greater than the absolute value of the threshold voltage of the PMOS transistors (|Vth(MNDEP0)|>|Vth(MP)|), then the first cascode transistor MNDEP0, the first mirror transistor MP0 and the second mirror transistor MP1 will turn on even if the second intermediate output node OUT2 is initially at 0V. On the other hand, if the absolute value of the threshold voltage of the first cascode transistor MNDEP0 is less than the absolute value of the threshold voltage of the PMOS transistors (|Vth(MNDEP0)|<|Vth(MP)|) then the initial voltage value at the second intermediate output node OUT2 equal to 0V is not high enough to turn on the first cascode transistor MNDEP0, the first mirror transistor MP0 and the second mirror transistor MP1.

However, being the gate terminal of the precharge transistor MNDEP1 connected to the precharge bias voltage VBIAS1, it would be sufficient that such a precharge bias voltage VBIAS1 is a positive voltage (>0V) having a value able to guarantee the following condition in all corners.

VBIAS1+|Vth(MNDEP0)|>|Vth(MP)|

More particularly, the precharge bias voltage VBIAS1 could be a suitable analog voltage to satisfy the above relationship; alternatively, the logic enable signal of the regulator 200 could be used as the precharge bias voltage VBIAS1, if its high state voltage value guarantees the above mentioned relationship.

In this way, the regulator 200 of FIG. 4 is able to ensure startup in all conditions.

It should be noted that the precharge bias voltage value VBIAS1 should be chosen lower than a voltage level at the second intermediate node OUT2 to make the precharge transistor MNDEP1 always turned off during the regulator on state. In this way the precharge transistor MNDEP1 operates only during the regulator startup and it automatically turns off when the regulator 200 has completed startup.

Figure 5:
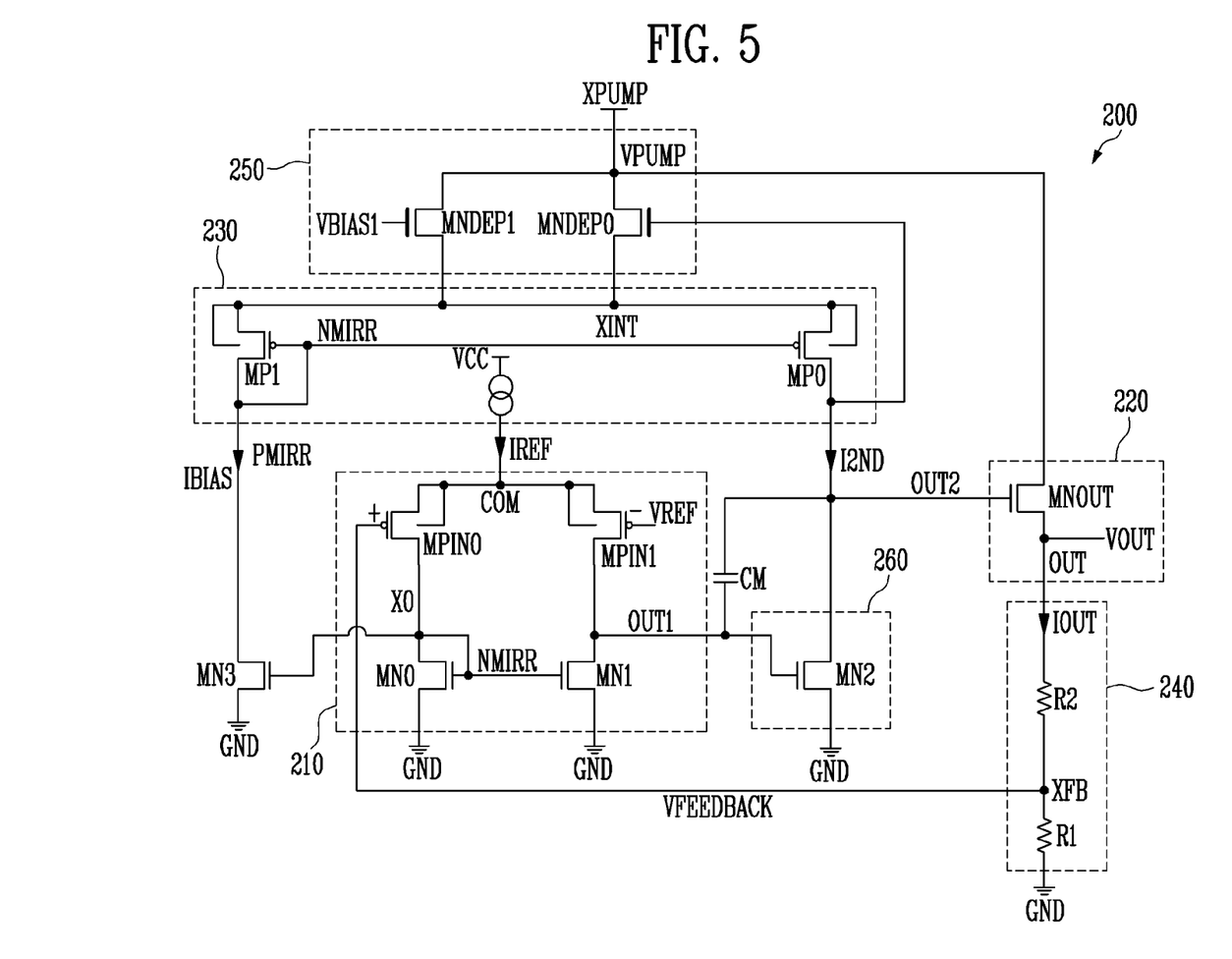

FIG. 5 schematically shows a circuit diagram of a regulator according to an alternative embodiment of the present invention.

The regulator 200 of FIG. 5 comprises all elements of regulator 200 of FIG. 4, having been indicated with the same reference numbers.

According to this alternative embodiment, the regulator 200 further comprises a compensation capacitor CM inserted between the second intermediate output node OUT2 of the mirror circuit 230 and the first intermediate output node OUT1 of the input amplifier 210.

Figure 6:
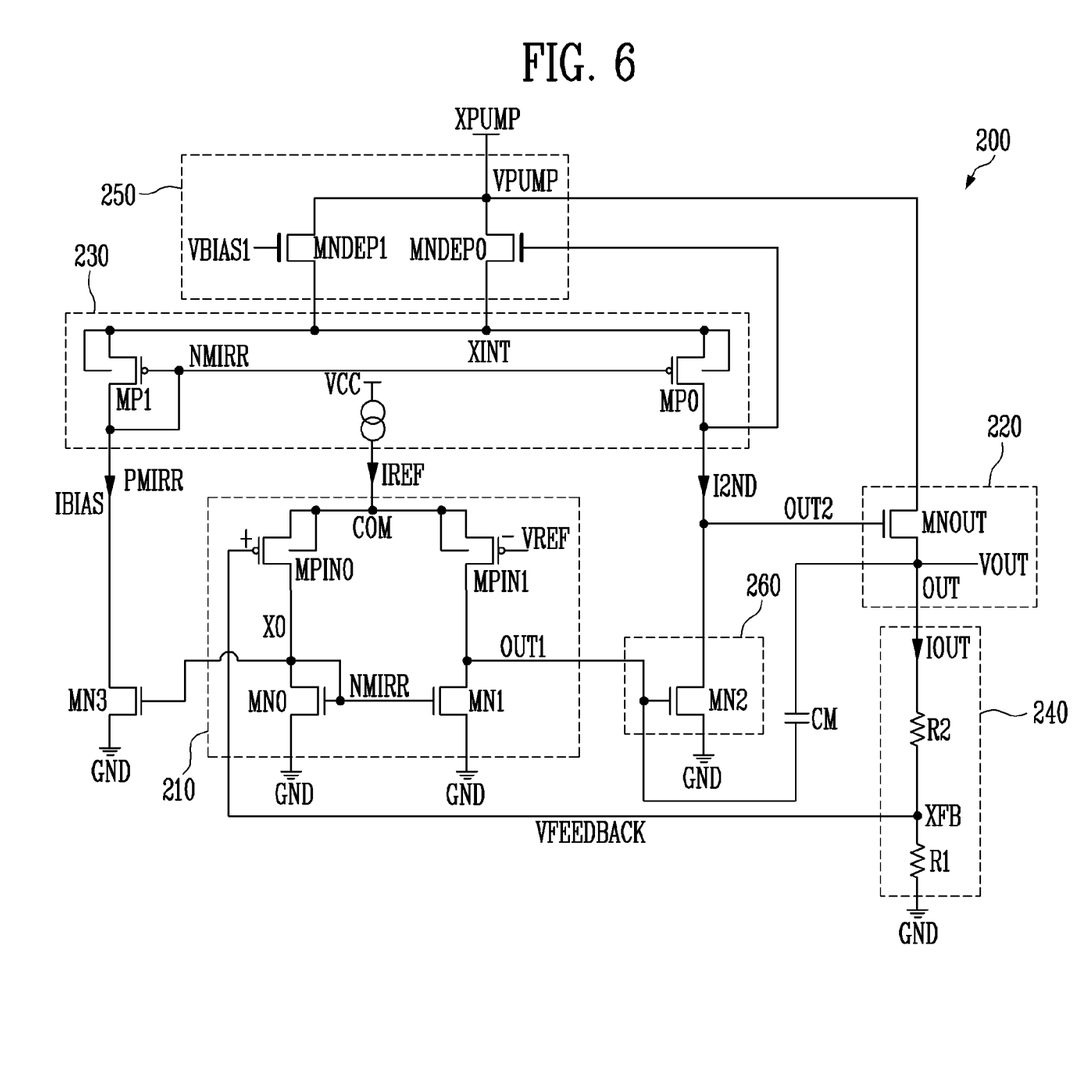

Alternatively, as shown in FIG. 6, the compensation capacitor CM is inserted between the output terminal OUT of the regulator 200 and the first intermediate output node OUT1 of the input amplifier 210.

The compensation capacitor CM acts as a Miller capacitor connected to the input amplifier 210 and being driven by the mirror circuit 230 according to the embodiment of FIG. 5 and by the output stage 220, being a source follower which can provide more current, according to the embodiment of FIG. 6.

In this way, the regulator 200 of FIGS. 5 and 6 is able to ensuring a stable feedback condition.

It will be apparent for those skilled in the art that frequency compensation capacitors represented in embodiments of FIG. 5 and FIG. 6 can be replaced by a series of a compensation capacitor and a compensation resistor or any other frequency compensation arrangement without deviating from the idea of this application.

Figure 7:
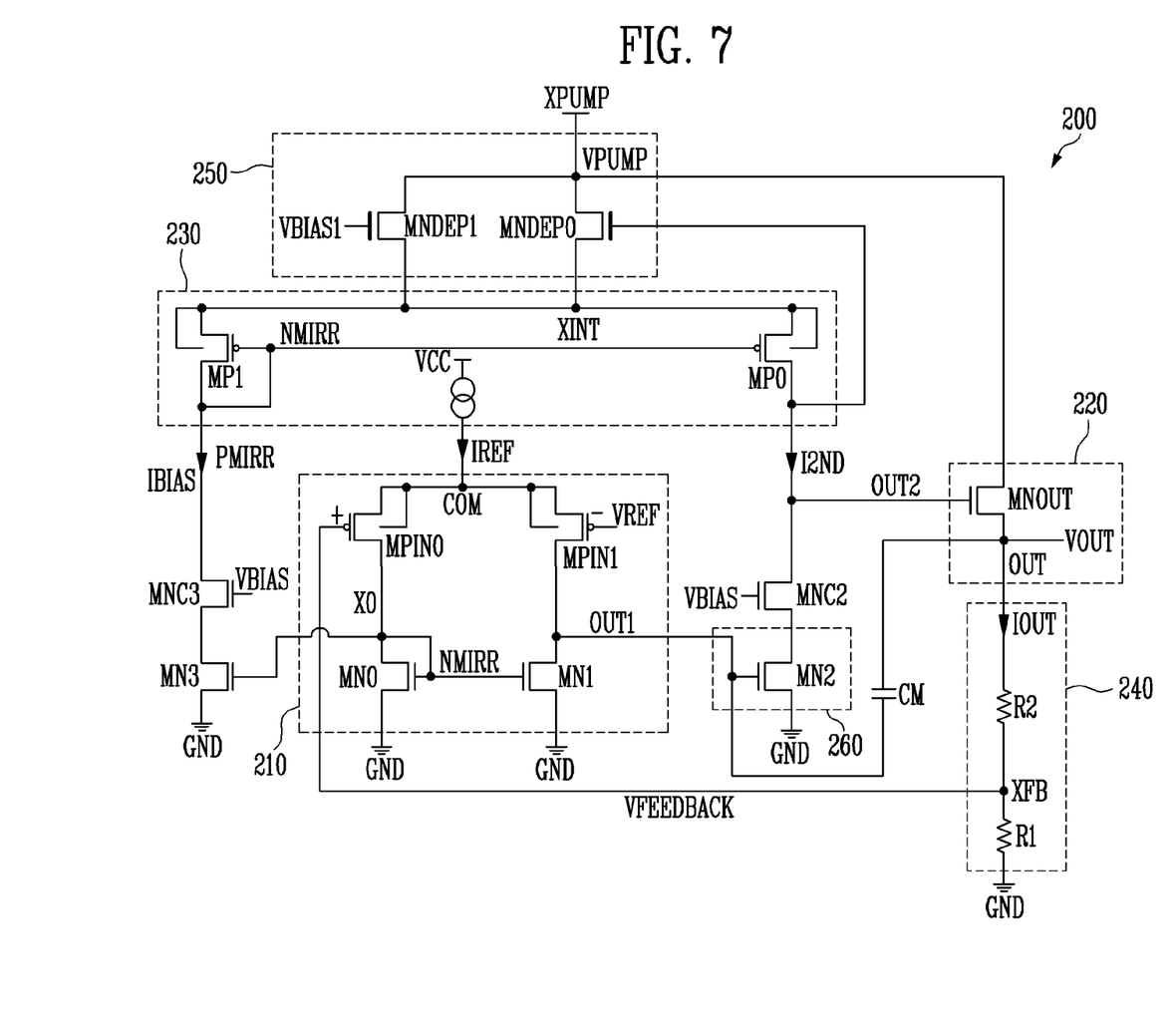

FIG. 7 schematically shows a circuit diagram of a regulator according to an alternative embodiment of the present invention.

The regulator 200 of FIG. 7 comprises all elements of regulator 200 of FIG. 6, having been indicated with the same reference numbers.

According to this alternative embodiment, the regulator 200 further comprises two NMOS transistors in cascode configuration.

In particular, the regulator 200 comprises a second cascode transistor MNC2 connected between the second intermediate output node OUT2 and the drain of the common source transistor MN2 and having a gate terminal receiving a bias voltage VBIAS and, similarly, a third cascode transistor MNC3 inserted between the further mirror circuit node PMIRR and the drain of the current buffer transistor MN3 and having a gate terminal receiving the bias voltage VBIAS.

With the insertion of the second cascode transistor MNC2 and the third cascode transistor MNC3 it is possible to make the current buffer transistor MN3 matched to the first output transistor MN0 of the input amplifier 210 and to make the common source transistor MN2 matched to the second output transistor MN1 of the input amplifier 210.

It should be noted that to make the current buffer transistor MN3 matched to the first output transistor MN0 and to make the common source transistor MN2 matched to the second output transistor MN1 means that these transistors have the same length and are of the same type, for example they are LV transistors.

This matching reduces the unwanted effect of voltage input offset of the regulator 200, thus improving the D/A conversion accuracy.

In an embodiment, the cascode transistors MNC2 and MNC3 may be high voltage transistors and the bias voltage VBIAS may be a suitable analog voltage.

In this way, the common source transistor MN2 and the current buffer transistor MN3 can be made by low voltage transistors, improving matching respectively with the first output transistor MN0 and the second output transistor MN1.

It should also be noted that the insertion of the cascode transistors MNC2 an MNC3 has also the beneficial effect of increasing the DC gain of the regulator 200.

Figure 8:
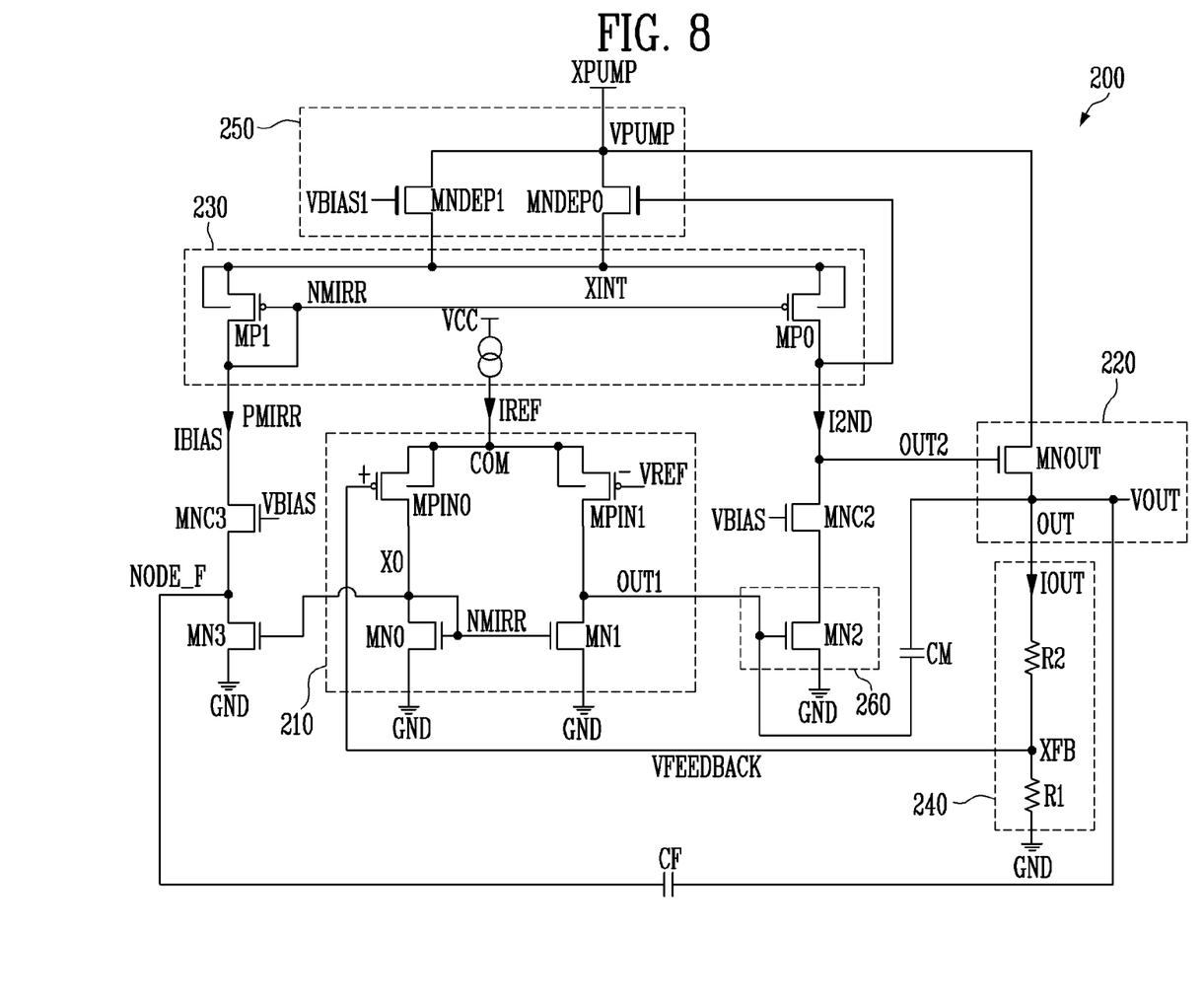

FIG. 8 schematically shows a circuit diagram of a regulator according to a further alternative embodiment of the present invention.

The regulator 200 of FIG. 8 comprises all elements of regulator 200 of FIG. 7, having been indicated with the same reference numbers.

According to this alternative embodiment, the regulator 200 further comprises a feedback capacitor CF, being inserted between the output terminal OUT and a further internal node NODE_F corresponding to a connection node between the current buffer transistor MN3 and the third cascode transistor MNC3.

In this way, when the output terminal OUT drops then the further internal node NODE_F has a sudden drop as it is capacitive coupled to the voltage at the output terminal OUT by means of the feedback capacitor CF. Such a sudden drop of the further internal node NODE_F causes the bias current IBIAS to suddenly increase above its steady state value due to a corresponding increase of the gate-source voltage difference Vgs of the third cascode transistor MNC3. In turn, the sudden increase of the bias current IBIAS causes the second stage current I2ND to suddenly increase above its steady state value thus making a fast increase of the second intermediate output node OUT2.

As a final result, a drop of the output terminal OUT of the regulator 200 is fast recovered due to the fast increase of the second intermediate output node OUT2 due to the feedback capacitor CF.

In this way, the regulator 200 of FIG. 8 has an improved drop recovery performance.

The aforementioned regulator uses a current mirror which allows to minimize DC bias current by decreasing its second stage current without causing an area penalty and a parasitic increase, and a cascode to protect such a current mirror, and in particular its first mirror transistor, from a breakdown voltage BV.

Moreover, by using a buffer transistor, the slew rate of the regulator can be enhanced, to allow fast startup and a fast output drop recovery of such a regulator.

A suitable precharge transistor could be also used to ensure a correct startup of the regulator in all conditions and a Miller capacitor could make the feedback regulator stable.

Finally, a cascode configuration could be provided to minimize the regulator offset and an additional feedback capacitor could be inserted to further improve drop recovery performance of the regulator.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed:

1. A regulator comprising:
a high voltage supply terminal, a low voltage supply terminal, an output terminal, a ground terminal and an internal node;
an input amplifier inserted between the low voltage supply terminal and the ground terminal and outputting a first output voltage at a first intermediate output node according to a reference voltage and a feedback voltage provided at its negative and positive input terminals, respectively;
a mirror circuit forming two current paths between the internal node and the ground terminal and between the internal node and a second intermediate output node of the regulator, respectively; and
a cascode block coupled between the high voltage supply terminal and the internal node and operating in response to a voltage at the second intermediate output node of the regulator where one of the two current paths is formed by the mirror circuit.

2. The regulator according to claim 1, further comprising an output stage including:
a final transistor inserted between the high voltage supply terminal and the output terminal of the regulator, acting as a source follower stage, and having a control terminal connected to the second intermediate output node of the regulator; and
a voltage divider stage formed by a series of a first resistor and a second resistor inserted between the output terminal of the regulator and the ground terminal of the regulator and having a common node providing the feedback voltage to the input amplifier.

3. The regulator according to claim 1, further comprising a common source transistor inserted between the second intermediate output node and the ground terminal and having a gate terminal connected to the first intermediate output node.

4. The regulator according to claim 1,
wherein the mirror circuit comprises:
a first mirror transistor inserted between the internal node and the second intermediate output node of the regulator;
a second mirror transistor being diode connected and inserted between the internal node and a further mirror circuit input node; and
a biasing current generator providing a bias current and connected between the further mirror circuit input node and the ground terminal, and
wherein the first mirror transistor and the second mirror transistor have respective control terminals interconnected.

5. The regulator according to claim 4, wherein the first mirror transistor and the second mirror transistor are PMOS transistors having respective bulk terminals connected to the internal node.

6. The regulator according to claim 1,
wherein the input amplifier comprises:
a current generator connected between the low voltage supply terminal and a common node and providing thereto a reference current;
a first input transistor inserted between the common node and a first circuit node and receiving the feedback voltage at its gate terminal, the first input transistor gate terminal being the positive input terminal of the input amplifier;
a second input transistor inserted between the common node and the first intermediate output node and receiving the reference voltage at its gate terminal, the second input transistor gate terminal being the negative input terminal of the input amplifier;
a first output transistor being diode-connected and coupled between the first circuit node and the ground terminal; and
a second output transistor inserted between the first intermediate output node and the ground terminal,
wherein the first output transistor and the second output transistor have respective gate terminals interconnected, and
wherein the first input transistor and the second input transistor have respective bulk terminals connected to the common node.

7. The regulator according to claim 1, wherein the cascode block comprises a first cascode transistor inserted between the high voltage supply terminal and the internal node and having a control terminal connected to the second intermediate output node, the first cascode transistor being a NMOS depletion transistor.

8. The regulator according to claim 7, wherein the cascode block further comprises a precharge transistor, which is inserted in parallel to the first cascode transistor between the high voltage supply terminal and the internal node and has a gate terminal receiving a precharge bias voltage.

9. The regulator according to claim 1,
wherein the mirror circuit comprises:
a first mirror transistor inserted between the internal node and the second intermediate output node of the regulator;
a second mirror transistor being diode connected and inserted between the internal node and a further mirror circuit input node; and
a current buffer transistor being inserted between the second mirror transistor and the ground terminal and having a control terminal connected to a circuit node of the input amplifier, and
wherein the first mirror transistor and the second mirror transistor have respective control terminals interconnected.

10. The regulator according to claim 9,
further comprising:
a second cascode transistor connected between the second intermediate output node and a common source transistor and having a control terminal receiving a bias voltage; and
a third cascode transistor inserted between the second mirror transistor and the current buffer transistor and having a control terminal receiving the bias voltage,
wherein the second cascode transistor is in cascode NMOS configuration with the common source transistor and the third cascode transistor is in cascode NMOS configuration with the current buffer transistor.

11. The regulator according to claim 1, further comprising a compensation capacitor inserted between the second intermediate output node of the regulator and the first intermediate output node of the input amplifier.

12. The regulator according to claim 1, further comprising a compensation capacitor inserted between the output terminal of the regulator and the first intermediate output node of the input amplifier.

13. The regulator according to claim 10, further comprising a feedback capacitor, being inserted between the output terminal of the regulator and a further internal node corresponding to a connection node between the current buffer transistor and the third cascode transistor.

14. The regulator according to claim 1, wherein the input amplifier comprises all low voltage transistors.

15. The regulator according to claim 2, wherein the mirror circuit comprises all high voltage transistors and the final transistor is a high voltage transistor.

16. The regulator according to claim 8, wherein the first cascode transistor and the precharge transistor are high voltage NMOS depletion transistors.

17. The regulator according to claim 3, wherein the common source transistor is a high voltage transistor.

18. The regulator according to claim 10, wherein the common source transistor is matched with second output transistor of input amplifier.

19. The regulator according to claim 10, wherein the current buffer transistor is matched with a first output transistor of the input amplifier being diode-connected and coupled between the circuit node and the ground terminal.

20. A regulator comprising:
an amplifier suitable for comparing a reference voltage and a feedback voltage to generate an intermediate voltage;
a first transistor coupled between an intermediate node and a ground and operative according to the intermediate voltage;
a second transistor coupled between a high voltage supply and an output node and operative according to a voltage level of the intermediate node;
a voltage divider stage coupled between the output node and the ground and suitable for generating the feedback voltage;
a third transistor coupled between the high voltage supply and an internal node and operative according to the voltage level of the intermediate node; and
a mirror circuit coupled to the internal node and suitable for generating a first current flowing from the internal node to the ground and a second current flowing from the internal node to the intermediate node,
wherein the mirror circuit comprises:
a first mirror transistor inserted between the internal node and the intermediate node;
a second mirror transistor being diode connected and inserted between the internal node and a further mirror circuit input node; and
a biasing current generator providing a bias current and connected between the further mirror circuit input node and the ground terminal, and
wherein the first mirror transistor and the second mirror transistor have respective control terminals interconnected.

* * * * *